(12) United States Patent
Jun

(10) Patent No.: US 6,852,606 B1
(45) Date of Patent: *Feb. 8, 2005

(54) METHOD FOR FORMING ISOLATION LAYER OF SEMICONDUCTOR DEVICE AND SEMICONDUCTOR DEVICE

(75) Inventor: Young Kwon Jun, Seoul (KR)

(73) Assignee: LG Semicon Co., LTD, Chungcheongbuk-do (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 330 days.

(21) Appl. No.: 08/855,363

(22) Filed: May 13, 1997

(30) Foreign Application Priority Data

Oct. 30, 1996  (KR) ........................................ 1996-49954

(51) Int. Cl.⁷ ............................................. H01L 21/762
(52) U.S. Cl. ..................................... 438/427; 438/444
(58) Field of Search ................................ 438/424, 427, 438/444, FOR 227, FOR 229

(56) References Cited

U.S. PATENT DOCUMENTS

| | | | | |
|---|---|---|---|---|
| 4,390,393 A | * | 6/1983 | Ghezzo et al. | |
| 4,396,460 A | * | 8/1983 | Tamaki et al. | |
| 4,472,240 A | * | 9/1984 | Kameyama | |
| 4,551,911 A | * | 11/1985 | Sasaki et al. | |
| 4,962,064 A | * | 10/1990 | Haskell | |
| 5,015,602 A | * | 5/1991 | Van Der Plas et al. | |
| 5,041,898 A | * | 8/1991 | Urabe et al. | |
| 5,298,450 A | * | 3/1994 | Verret | |
| 5,316,966 A | * | 5/1994 | Van Der Plas et al. | |
| 5,371,036 A | * | 12/1994 | Lur et al. | |
| 5,536,675 A | * | 7/1996 | Bohr | |
| 5,747,377 A | * | 5/1998 | Wu | 438/444 |
| 5,817,567 A | * | 10/1998 | Jang et al. | |
| 5,893,744 A | * | 4/1999 | Wang | |
| 5,895,253 A | * | 4/1999 | Akram | |
| 5,899,727 A | * | 5/1999 | Hause et al. | |
| 5,937,311 A | * | 8/1999 | Nagatomo | |

* cited by examiner

*Primary Examiner*—George Fourson

(57) ABSTRACT

A method for forming an isolation layer of a semiconductor device which is capable of improving isolation characteristics of a highly integrated semiconductor device. The method includes the steps of forming a first insulating layer on a substrate; forming both a first recess in the first isolation region and a plurality of second recesses in the second isolation region by only once applying a photolithography process to the first insulating layer; forming a third recess, which is deeper than the first recess, in the center area of the first recess in the first isolation region; and filling the first, second, third recesses with insulating materials or a thermal oxide layer. In addition, in the semiconductor device in which the isolation region has different widths, the first isolation region which is relatively narrower in width than the second isolation region has a deeper recess than the second isolation region.

13 Claims, 7 Drawing Sheets

F I G.5a
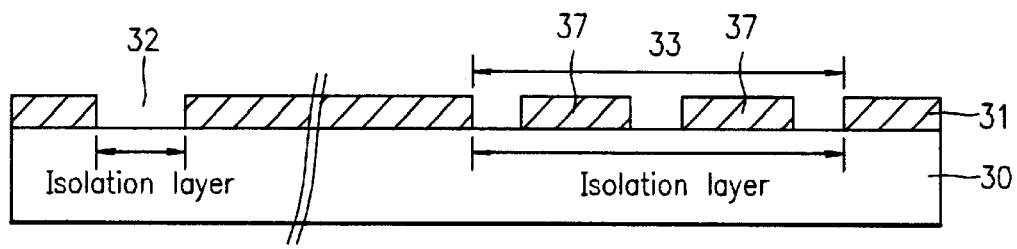
F I G.5b
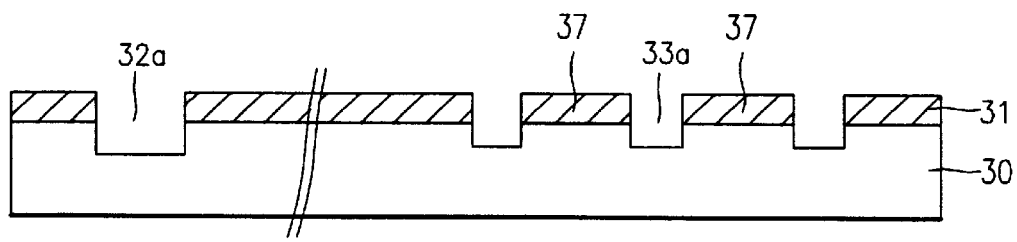
F I G.5c
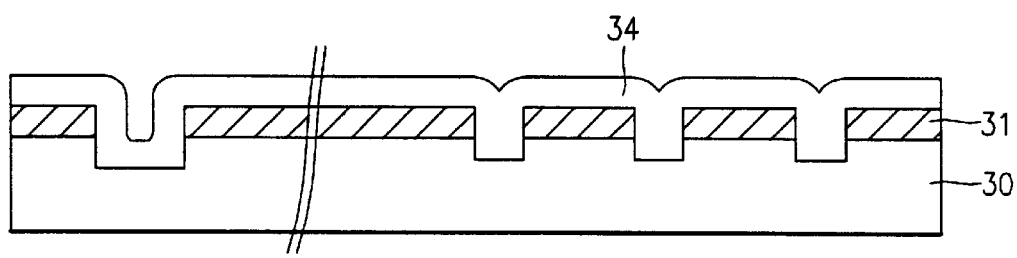
F I G.5d
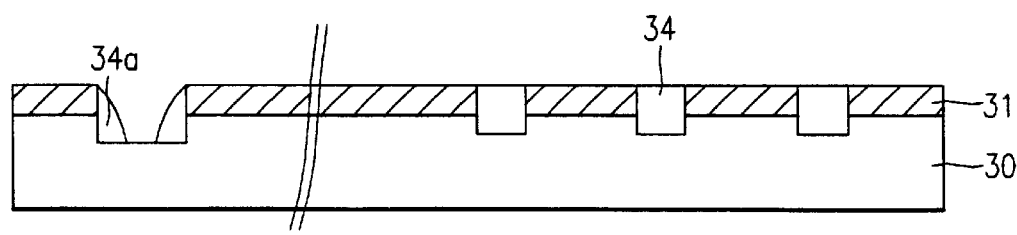

F I G.5e
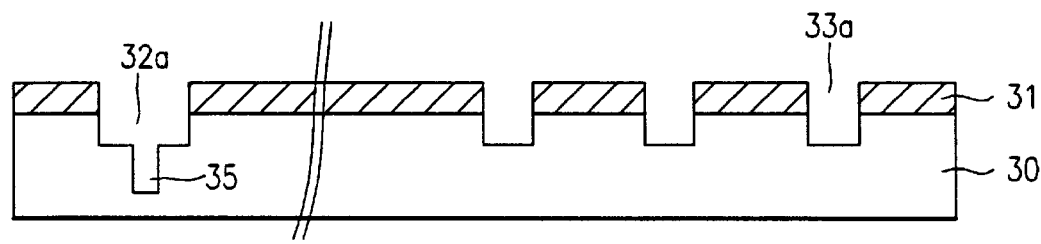
F I G.5f
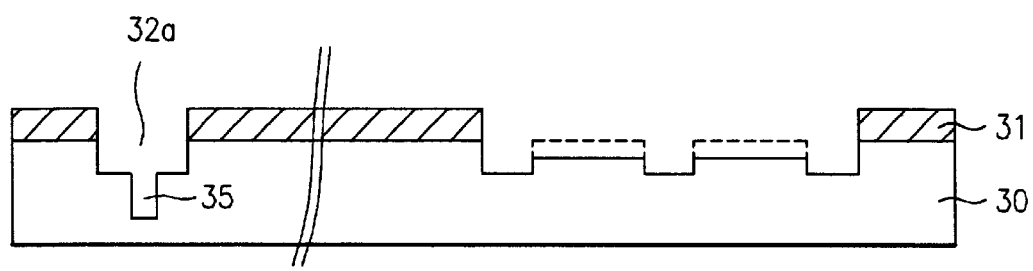
F I G.5g
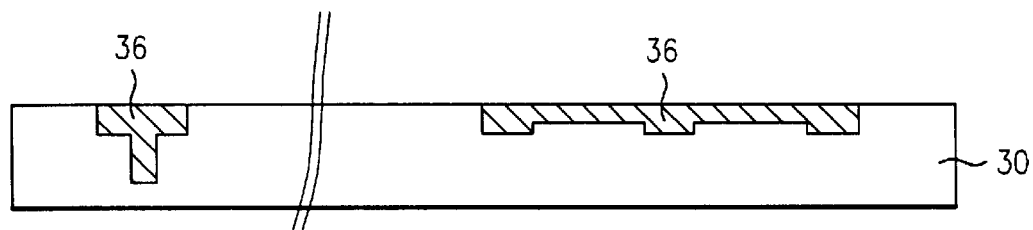

F I G.9d
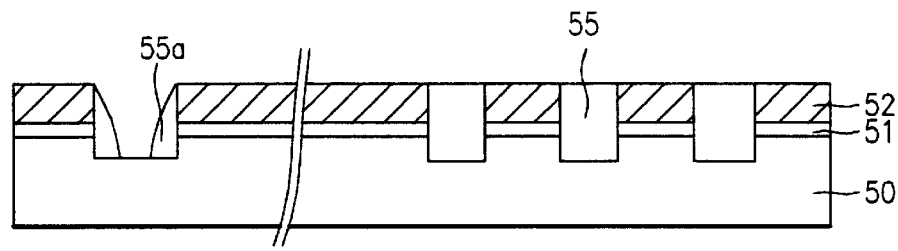
F I G.9e
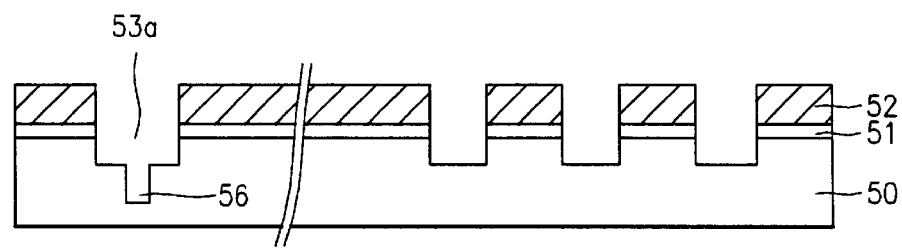
F I G.9f
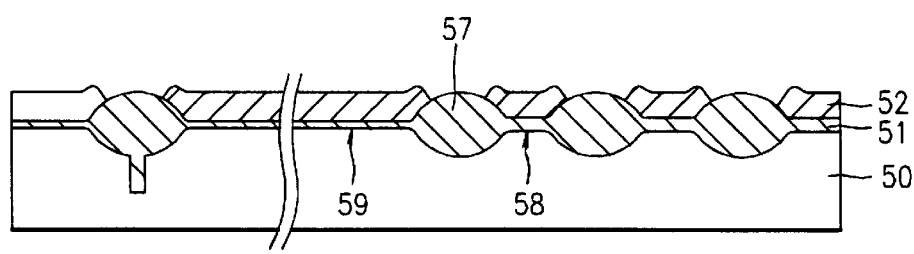
F I G.9g
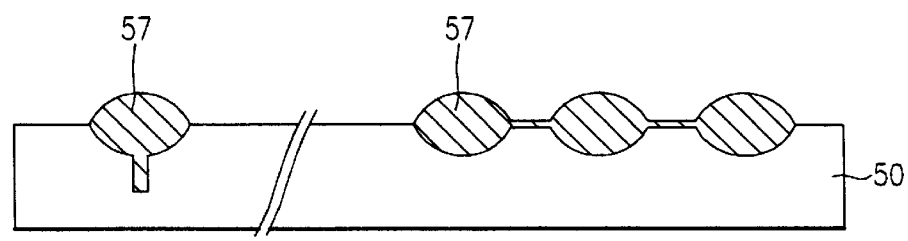

METHOD FOR FORMING ISOLATION LAYER OF SEMICONDUCTOR DEVICE AND SEMICONDUCTOR DEVICE

BACKGROUND OF THE INVENTION

1. Field of the Invention

The present invention relates to a method for forming an isolation layer of a semiconductor device and the semiconductor device. More particularly, the present invention relates to a method for forming an isolation layer of a semiconductor device which is capable of improving isolation characteristics of a highly integrated semiconductor device.

2. Discussion of the Related Art

A conventional method for forming an isolation layer of a semiconductor device will be described with reference to the accompanying drawings.

Referring to FIGS. 1a through 1d, there is illustrated a conventional method for forming an isolation layer of a is semiconductor device. As shown in FIG. 1a, a first insulating layer 2 is formed on a semiconductor substrate 1, by a CVD process. In this case, the first insulating layer 2 has a thickness of 1 µm. The first insulating layer 2 is partially patterned by an RIE (reactive ion etching) process until a predetermined portion of the substrate 1 is exposed, thereby forming a contact hole. Next, a second insulating layer 3 of a thickness of 0.1 µm is formed on the entire surface inclusive of the exposed substrate 1 by the CVD process.

Subsequently, etch back is applied to the second insulating layer 3 so as to form a sidewall spacer 3a and then, the substrate 1 is etched by a predetermined depth with the first insulating layer 2 and the sidewall spacer 3a serving as masks, as shown in FIG. 1b. In this case, the substrate is etched by a width of 0.1 µm and a depth of 0.5 µm.

Next, the first insulating layer 2 and the sidewall spacer 3a, as shown in FIG. 1c, are removed to expose the surface of the substrate 1. Also, the surface of the substrate 1 is annealed for recovering the damage of the substrate 1 caused by the removal of the first insulating layer 2 and the sidewall spacer 3a, and there is grown an oxide layer 4 of a width of 200 Angstroms is grown on the entire surface of the substrate 1. After the growth, a third insulating layer 5 of a thickness of 3000 Angstroms is formed on the oxide layer 4 by the CVD process and then, a photoresist layer is coated on the third insulating layer 5. Subjected to exposure and development, the photoresist layer is patterned to form a photoresist pattern 6.

Referring to FIG. 1d, with the photoresist pattern 6 serving as a mask, the third insulating layer 5 is partially removed by the RIE process. After this removal, boron ions are implanted into the substrate three times; each time the boron ions have a different energy. In this case, the amount of boron ions is $3 \times 10^{12}$ ions/cm$^2$ and energies of the ions are 130 KeV, 180 KeV and 260 KeV.

The conventional method for forming an isolation layer of a semiconductor device has the following problems.

First, a semiconductor substrate may be impaired due to etch of an isolation region of the substrate. Further, since the isolation region is etched at a very steep slope angle, focus of charge currency is generated, thereby causing leakage current.

Second, when the isolation region is a large pattern, an etch width of the substrate 1 is increased so that the planarization of the surface of the isolation region becomes inferior.

SUMMARY OF THE INVENTION

Accordingly, the present invention is directed to a method for forming an isolation layer of a semiconductor device and semiconductor device that substantially obviates one or more of problems due to limitations and disadvantages of the related art.

An object of the invention is to provide a method for forming an isolation layer of a semiconductor device and semiconductor device which have an excellent planarization regardless of a width of the isolation region.

Another object of the invention is to simplify the forming process steps by a photolithography process carried out once over both first and second isolation regions at the same time.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method for forming an isolation layer of a semiconductor device in which a substrate has a first isolation region and a second isolation region which is wider than the first isolation region includes the steps of: forming a first insulating layer on a substrate; forming both a first recess in the first isolation region and a plurality of second recesses in the second isolation region by only once applying a photolithography process to the first insulating layer; forming a third recess, which is deeper than the first recess, in center area of the first recess in the first isolation region; and filling the first, second and third recesses with insulating materials or a thermal oxide layer. In addition, in the semiconductor device in which the isolation regions have different widths, the first isolation region which is relatively narrower in width than the second isolation region, has a deeper recess than the second isolation region.

It is to be understood that both the foregoing general description and the following detailed description are exemplary and explanatory, and are intended to provide further explanation of the invention as claimed.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 5a–5g are cross-sectional views showing a method for forming an isolation layer of a semiconductor device in accordance with line III-III' and line IV-IV' of FIG. 2;

FIGS. 9a–9g are cross-sectional views showing a method for forming an isolation layer of a semiconductor device in accordance with line VII-VII' and line VIII-VIII' of FIG. 6.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

Reference will now be made in detail to the preferred embodiments of the present invention, examples of which are illustrated in the accompanying drawings.

Figure 1A:
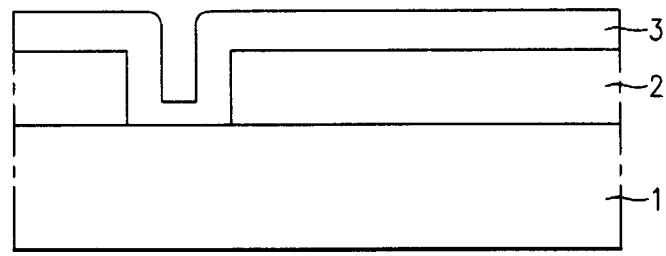
FIGS. 1a through 1d are cross-sectional views showing a conventional method for forming an isolation layer of a semiconductor device.
Figure 1B:
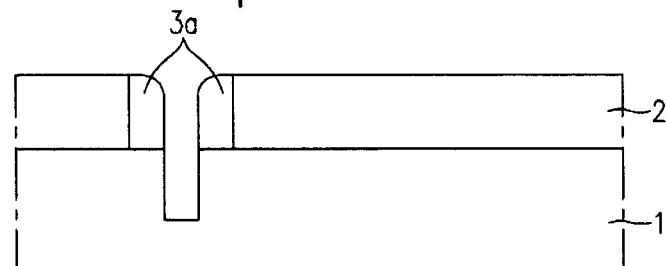
Figure 1C:
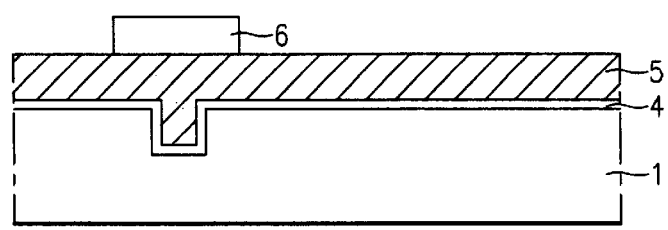
Figure 1D:
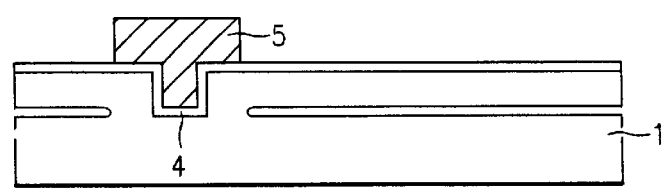
Figure 2:
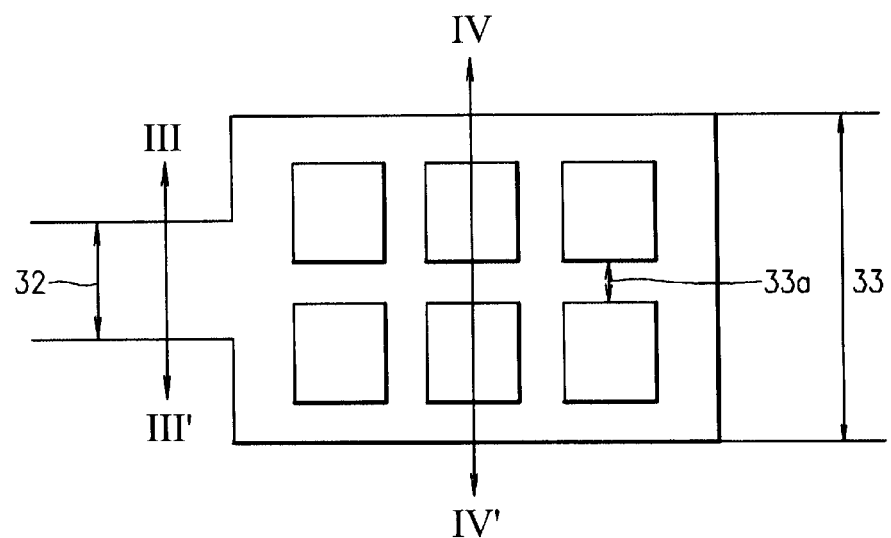
FIG. 2 is a layout of a semiconductor device in accordance with a first embodiment of the present invention.
Figures 3, 4:
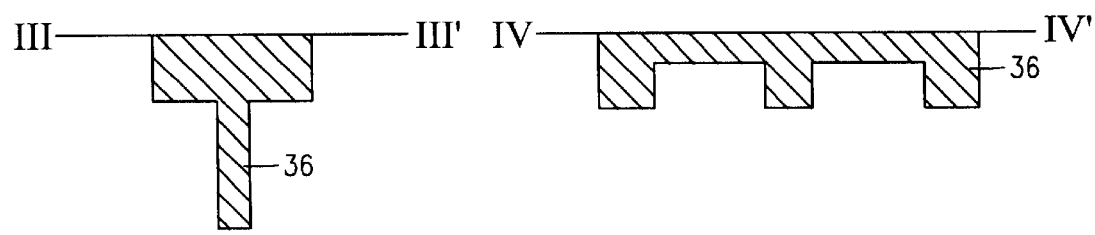
FIG. 3 is a cross-sectional view cut along line III-III' showing a structure of FIG. 2.
FIG. 4 is a cross-sectional view cut along line IV-IV' showing a structure of FIG. 2.

FIG. 2 is a layout of a semiconductor device in accordance with a first embodiment of the present invention. FIG. 3 is a cross section cut along line III-III' showing a structure of FIG. 2, FIG. 4 is a cross section cut along line IV-IV' showing a structure of FIG. 2, and FIGS. 5a through 5g are cross sections showing a method for forming an isolation layer of a semiconductor device in accordance with line III-III' and line IV-IV'. In this case, depending on characteristics of the semiconductor device and its design, widths of the various isolation regions may vary. FIG. 2 illustrates isolation regions of a semiconductor device with varying widths.

Referring to FIGS. 3 and 4, the isolation region 32 which is relatively narrow, when compared to isolation region 33, and the isolation region 33 which is relatively wide, are etched by a predetermined depth and then, an insulating layer 36 fills the etched areas so that the insulating layer 36 in the isolation regions evenly planarizes the surface of the substrate. However, in the relatively narrow isolation region 32, the substrate is etched deep to form a recess in a conventional manner. In contrast, in the relatively wide isolation region 33, the substrate is partially etched to form a plurality of island regions thereon.

Referring to FIGS. 5a through 5f, there is illustrated a method for making an isolation layer of a semiconductor device depending on a width of an isolation region according to a first embodiment of the present invention. These figures are cross-sectional views showing a method for forming an isolation layer corresponding to the FIG. 2 cut along lines III-III' and IV-IV'.

First, in order to make a semiconductor device having a relatively narrow isolation region 32 and a relatively wide isolation region 33, a first insulating layer 31 is formed on a semiconductor substrate 30 and then, a photoresist layer (not shown) is coated on the first insulating layer 31, as shown in FIG. 5a. The photoresist layer is subjected to exposure and development and patterned, so as to form a photoresist pattern (not shown).

Subsequently, with the photoresist pattern serving as a mask, the first insulating layer 31 is partially etched so as to expose the surface of the substrate 30 thereunder, thereby forming a relatively narrow first isolating region 32 and a relatively wide second isolation region 33. In this case, the first insulating layer 31 in the relatively narrow isolation region 32 is removed to expose the entire width of the substrate 30. In contrast, the first insulating layer 31 in the relatively wide isolation region 33 is partially removed to make island regions 37 having a predetermined width of gaps between the island forms. Herein, the width of the first insulating layer 31 removed in the relatively wide second isolation region 33 is narrower than that in the relatively narrow first isolation region.

Referring to FIG. 5b, the photoresist pattern is removed. With the first insulating layer 31 as a mask, the substrate exposed in both the first and second isolation regions 32, 33 is etched by a predetermined depth to form a first recess 32a, and a plurality of second recesses 33a. That is to say, there is formed only one first recess 32a in the first isolation region 32, while there are formed a plurality of recesses 33a in the second isolation region 33. For the first insulating layer 31, either a silicon nitride layer or a silicon oxide layer is used. The first and second isolation regions 32, 33 are patterned at the same time.

In another embodiment, the RIE (reactive ion etching) process or the CDE (chemical dry etching) process is applied to the substrate 30 to form the first and second recesses 32a, 33a. Further, the second recesses 33a are etched to have a narrower width than that of the first recess 32a and then, ion implantation of a channel stop is performed.

Next, the CVD process is applied to the substrate 30 inclusive of the first insulating layer 31 to form a protecting layer 34, as shown in FIG. 5c. In this case, either a silicon nitride layer or silicon oxide layer is used as the protecting layer 34, which is formed to be thick enough to fill in the second recesses 33a between gaps of the first insulating layer 31.

Referring to FIG. 5d, etch back is applied to the protecting layer 34 thicker than the thickness of the protecting layer 34, so as to form a protecting layer sidewall spacer 34a in the side of the first recess 32a, and so as to bury the second recesses 33a. Since the second recesses 33a have a narrower width than the first recess 32a does, a predetermined portion of the substrate 30 is exposed surrounding the protecting layer sidewall spacers 34a on the side of the first recess 32a, whereas the second recesses 33a are buried with the protecting layer 34.

Thereafter, utilizing the protecting layer sidewall spacer 34a as a mask, the exposed area of the substrate 30 in the first recess 32a is etched by a predetermined depth to form a third recess 35 as shown in FIG. 5e. In this case, with the first insulating layer 31 and the protecting layer 34 serving as masks, ion implantation of a channel stop may be performed, and then the protecting layer sidewall spacers 34a in the first recess 32a and the protecting layer 34 in the second recess are removed.

Referring to FIG. 5f, using a CMP (chemical mechanical polishing) process, the first insulating layer 31 in the second isolation region 33 is removed and the island regions 37 of the substrate 30 thereunder are removed by a predetermined depth. With the first insulating layer 31 serving as a mask, ion implantation of a channel stop is carried out.

Finally, referring to FIG. 5g, a second insulating layer 36 is formed on the entire surface of the substrate inclusive of the first, second, and third recesses 32a, 33a, 35, and is subjected to etch back so that the first, second, and third recesses 32a, 33a, 35 are filled in with the second insulating layer 36. The first insulating layer 31 is removed, thereby forming an isolation layer for isolating one device from another. In this case, the second insulating layer 36 must be thick enough to fill in the first, second, and third recesses 32a, 33a, 35 and then, is subjected to etch back. Herein, the second insulating layer 36 is an oxide layer. The CMP process used as the etch back is subjected to the second insulating layer, thereby planarizing the surface of the substrate 30. In the CMP process, polishing particles such as Alumina or silica, and the polishing solvent such as ammonium fluoride and aqueous ammonia are used.

Figure 6:
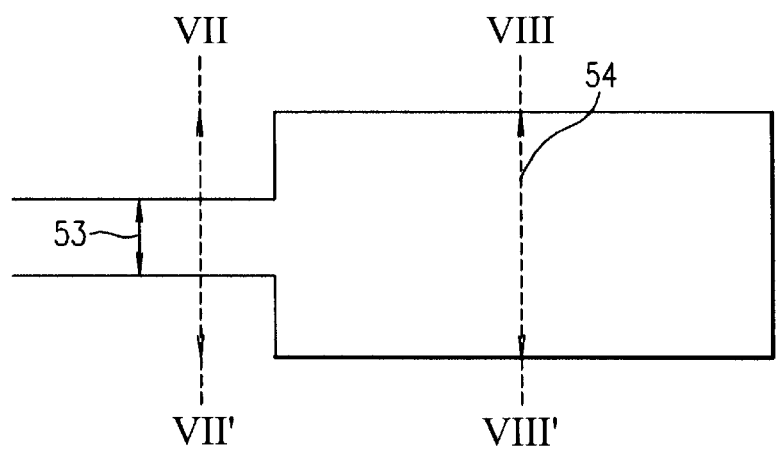
FIG. 6 is a layout of a semiconductor device in accordance with a second embodiment of the present invention.
Figures 7, 8:
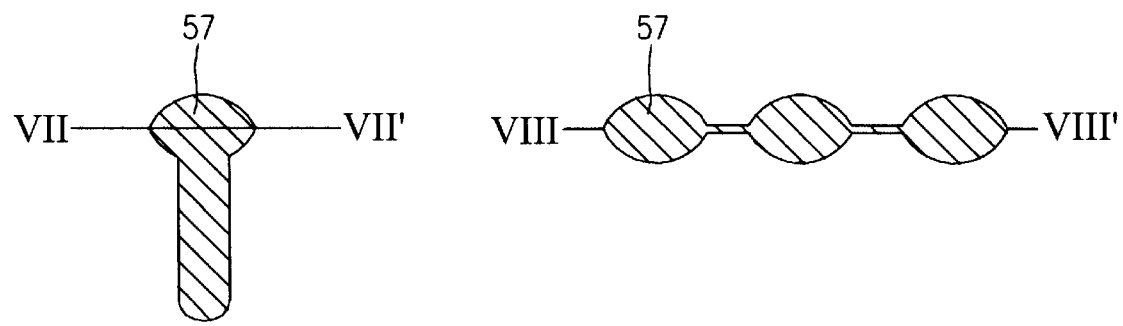
FIG. 7 is a cross-sectional view cut along line VII-VII' of FIG. 6.
FIG. 8 is a cross-sectional view cut along line VIII-VIII' of FIG. 6.

FIG. 6 is a layout of a semiconductor device according to a second embodiment of the invention, FIG. 7 is a cross-sectional view cut along line VII-VII' of FIG. 6 showing a structure of the device, and FIG. 8 is a cross-sectional view cut along line VIII-VIII' of FIG. 6 showing a structure of the device. FIGS. 9a through 9f are cross-sectional views cut along line VII-VII' and line VIII-VIII' of FIG. 6 showing a method for forming an isolation layer of the semiconductor device.

How wide an isolation layer is depends on performance of the device and its design.

Referring to FIG. 6, there is illustrated an isolation layer of a semiconductor device where widths between isolation regions are different.

Referring to FIG. 7 and FIG. 8, the relatively narrow isolation region 53 and the relatively wide isolation region 54 are etched by predetermined different depths respectively, and the isolation layer 57 is formed to protrude in a round shape from the substrate.

In the relatively narrow isolation region 53, the recess is etched in a rounded shape, whereas, in the relatively wide isolation region 54, the recesses are connected in a dumbbell shape.

Referring to FIGS. 9a through 9f, there is illustrated another method for forming an isolation region for separating devices from one another according to line VII-VII' and line VIII-VIII' of FIG. 6.

Figure 9A:
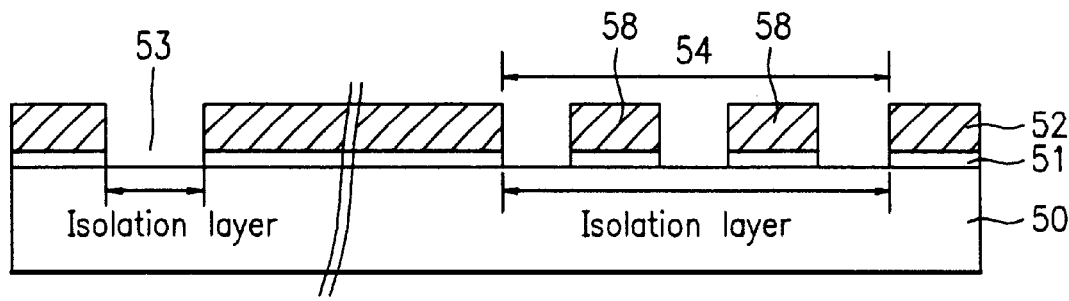

Referring to FIG. 9a, in order to manufacture a semiconductor device having a relatively narrow first isolation region 53 and a relatively wide second isolation region 54, a first insulating layer 51 and then a second insulating layer 52 are formed on a semiconductor substrate 50, a mask layer for preventing oxidation is formed, and a photoresist layer (not shown) is coated on the second insulating layer 52. Subjected to exposure and development, the photoresist layer is patterned to form a photoresist pattern (not shown) and then, the first and second insulating layers 51, 52 in the relatively narrow first isolation region 53 and the relatively wide second isolation region 54 respectively are partially removed. The first and second insulating layers 51, 52 in the first isolation region 53 are removed by the whole width to expose the entire substrate thereunder. In contrast, the first and second insulating layers 51, 52 in the relatively wide second isolation region 54 are partially removed so that only island shapes remain. In this case, the first and second insulating layers 51, 52 removed in the relatively wide second isolation region 54 have the width of at least narrower than the relatively narrow first isolation region 53.

The first insulating layer 51 is an oxide layer and the second insulating layer 52 is a silicon nitride layer. The first and second insulating layers 51, 52 are mask layers for preventing oxidation. A stack of a silicon nitride layer and a silicon oxide layer is used instead of a stack of an oxide layer and a silicon nitride layer.

Figure 9B:
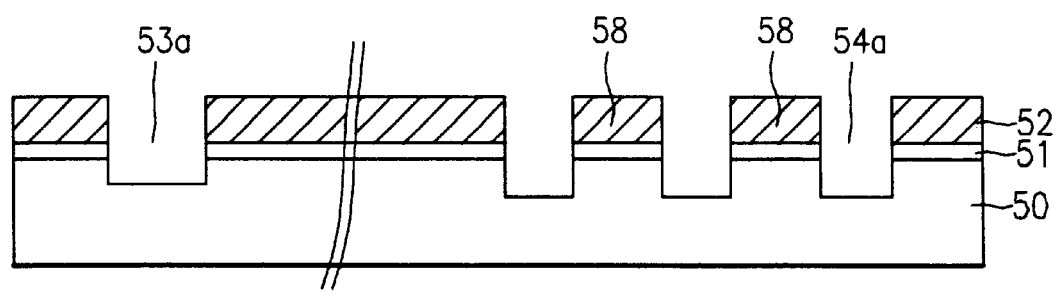

Referring to FIG. 9b, with the first insulating layer 51 and the second insulating layer 52 serving as masks, the exposed area of the substrate 50 in the first and second isolation regions 53, 54 is etched by a predetermined depth to form first and second recesses 53a, 54a. In a sectional view, there is one first recess 53a in the first isolation region 53, and there are a plurality of second recesses 54a in the second isolation region 54. The RIE process or the CDE process is applied to the substrate 50 to form first and second recesses 53a, 54a. After the second recesses 54a are formed to have a width narrower than that of the first recess 53a, ion implantation of a channel stop is carried out with the photoresist layer and the first and second insulating layers 51, 52 serving as masks.

Figure 9C:
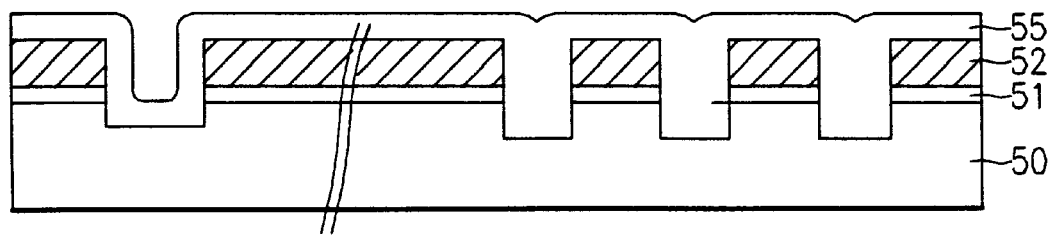

Referring to FIG. 9c, the photoresist layer is removed, and the CVD process is applied to the substrate 50 inclusive of the second insulating layer 52, thereby forming a protecting layer 55, which is formed of a silicon oxide and has a thickness that fill in the second recesses 54a.

Referring to FIG. 9d, etch back is applied to the protecting layer 55 thicker than the thickness of the protecting layer 55 so that the protecting layer 55 forms a protecting layer sidewall spacer 55a in the first recess 53a and fills in the second recesses 54a. In other words, since the second recesses 54a have a narrower width than the first recess 53a, a predetermined portion of the substrate is exposed surrounded by the protecting layer sidewall spacer 55a formed in the first recess 53a. In contrast, the second recesses 54a are filled in with the protecting layer 55.

Referring to FIG. 9e, with the protecting layer sidewall spacer 55a serving as a mask, the etched area of the substrate 50 in the first recess 53a is etched by a predetermined depth to form a third recess 56. In this case, with the first and second insulating layers 51, 52 and the protecting layer 55 serving as masks, ion implantation of a channel stop may be achieved, and the protecting layer sidewall spacer 55a in the first recess 53a and the protecting layer 55 in the second recesses 54a are removed.

Finally, with the first and second insulating layers 51, 52 serving as masks, the first, second, and third recesses 53a, 54a, and 56 are annealed in an oxide condition at not less than 800° C., thereby forming a third insulating layer 57 of a thickness of 3000–5000 Angstroms. At the same time, due to bird's peak, the third insulating layer 57 and the first insulating layer 51 are interconnected to each other. The remaining first and second insulating layers 51, 52 are removed. The third insulating layer 57 is an oxide layer.

As shown in FIG. 9g, the second insulating layer 52 and the first insulating layer 51 are selectively removed to leave the thicker portion 58 of the first insulating layer 51. The third insulating layer 57 is an oxide layer.

The methods of the present invention have the following advantages.

First, since the isolation layer is formed vertically as well as laterally in the first and second isolation regions, insulation characteristics of the device are enhanced.

Second, since a mask is used to form the first and second isolation regions in the photolithography process at the same time, the process steps are simplified.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of forming an isolation layer of a semiconductor device, comprising:
 a) forming a first insulating layer on a substrate;
 b) partially etching the first insulating layer to expose a surface of the substrate to form a narrow first isolation region and a second isolation region wider than the first isolation region;

c) forming a single first recess in said first isolation region of the substrate and the first insulating layer and a plurality of second recesses in said second isolation region of the substrate and the first insulating layer;

d) forming a third recess, deeper than the first recess, in a center area of the first recess;

e) filling the first, second, and third recesses with a second insulating material such that the second insulating material filling the plurality of second recesses is connected; and f) removing the first insulating layer such that the second insulating material filling the second recesses remains connected after the first insulating layer has been removed.

2. The method of claim 1, wherein each of the second recesses has a width narrower than a width of the first recess.

3. The method of claim 1, wherein the second insulating layer is formed by a CVD process.

4. The method of claim 1, wherein the first insulating layer is a silicon nitride layer or a silicon oxide layer.

5. The method of claim 1, wherein the second insulating layer is a silicon nitride layer or a silicon oxide layer.

6. The method of claim 1, wherein the step f) removes the portion of the first insulating layer and the substrate between the second recesses by chemical mechanical polishing.

7. The method of claim 1, wherein the step e) anneals the substrate in an oxide environment to fill the first recess and the second recesses with the second insulating material such that the second insulating material filling the plurality of second recesses is connected.

8. The method of claim 7, wherein the step e) anneals the substrate at a temperature of 800 degrees Celsius and has a thickness of 3000–5000 Angstroms.

9. The method of claim, 1, wherein the step c) forms the first recess and the second recesses using a single photolithography process.

10. The method of claim 1, prior to the step e), further comprising:

g) forming side walls of a second insulating material in the first recess;

h) forming the third recess in the first recess using the side walls as a mask; and i) removing the side walls.

11. The method of claim 1, wherein the step c) uses a reactive ion etching process or a chemical dry etching process to form the first recess and the second recesses.

12. The method of claim 1, wherein the step c) simultaneously forms the first recess and the second recesses.

13. The method of claim 1, further comprising:

(g) prior to the step c), removing a portion of the first insulating layer and the substrate between the second recesses; and wherein the step c) forms the second insulating material on the portion of the substrate between the second recesses.

* * * * *